United States Patent
Hayashihara

(10) Patent No.: US 6,912,377 B2
(45) Date of Patent: Jun. 28, 2005

(54) LEAK POWER RATIO DETECTION CIRCUIT, MOBILE COMMUNICATION TERMINAL, AND CONTROL CIRCUIT FOR MOBILE COMMUNICATION TERMINAL

(75) Inventor: Mikio Hayashihara, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 789 days.

(21) Appl. No.: 09/934,675

(22) Filed: Aug. 23, 2001

(65) Prior Publication Data

US 2002/0025789 A1 Feb. 28, 2002

(30) Foreign Application Priority Data

Aug. 30, 2000 (JP) ........................................ 2000-261575

(51) Int. Cl.[7] .............................................. H04B 17/00
(52) U.S. Cl. ................................ 455/115.1; 455/115.3; 455/127.1
(58) Field of Search .......................... 455/115.1, 115.3, 455/115.4; 425/127.1, 127.2, 127.3

(56) References Cited

U.S. PATENT DOCUMENTS 5,699,383 A * 12/1997 Ichiyoshi .................... 375/297
5,712,593 A   1/1998 Buer et al.
6,230,022 B1 * 5/2001 Sakoda et al. .............. 455/522

* cited by examiner

Primary Examiner—Creighton Smith
(74) Attorney, Agent, or Firm—Oblon, Spivak, McClelland, Maier & Neustadt, P.C.

(57) ABSTRACT

A squaring circuit squares a radio transmission signal. A band-pass filter extracts a spectrum component corresponding to a desired channel, from that low-frequency component of the output of the squaring circuit, which occurs with a center thereof being present near a DC (Direct Current). A level measuring circuit measures the level of the extracted spectrum component. On the other hand, another band-pass filter extracts, from the output of the squaring circuit, a spectrum component corresponding to spectrum spreading due to a distortion in a transmission circuit. Another level measuring circuit measures the level of this extracted spectrum component. A level radio measuring circuit measures a ratio between the level measured by the level measuring circuit and the level measured by the other level measuring circuit, and produces the measured result as a ratio of a leak power to an adjacent channel.

17 Claims, 8 Drawing Sheets

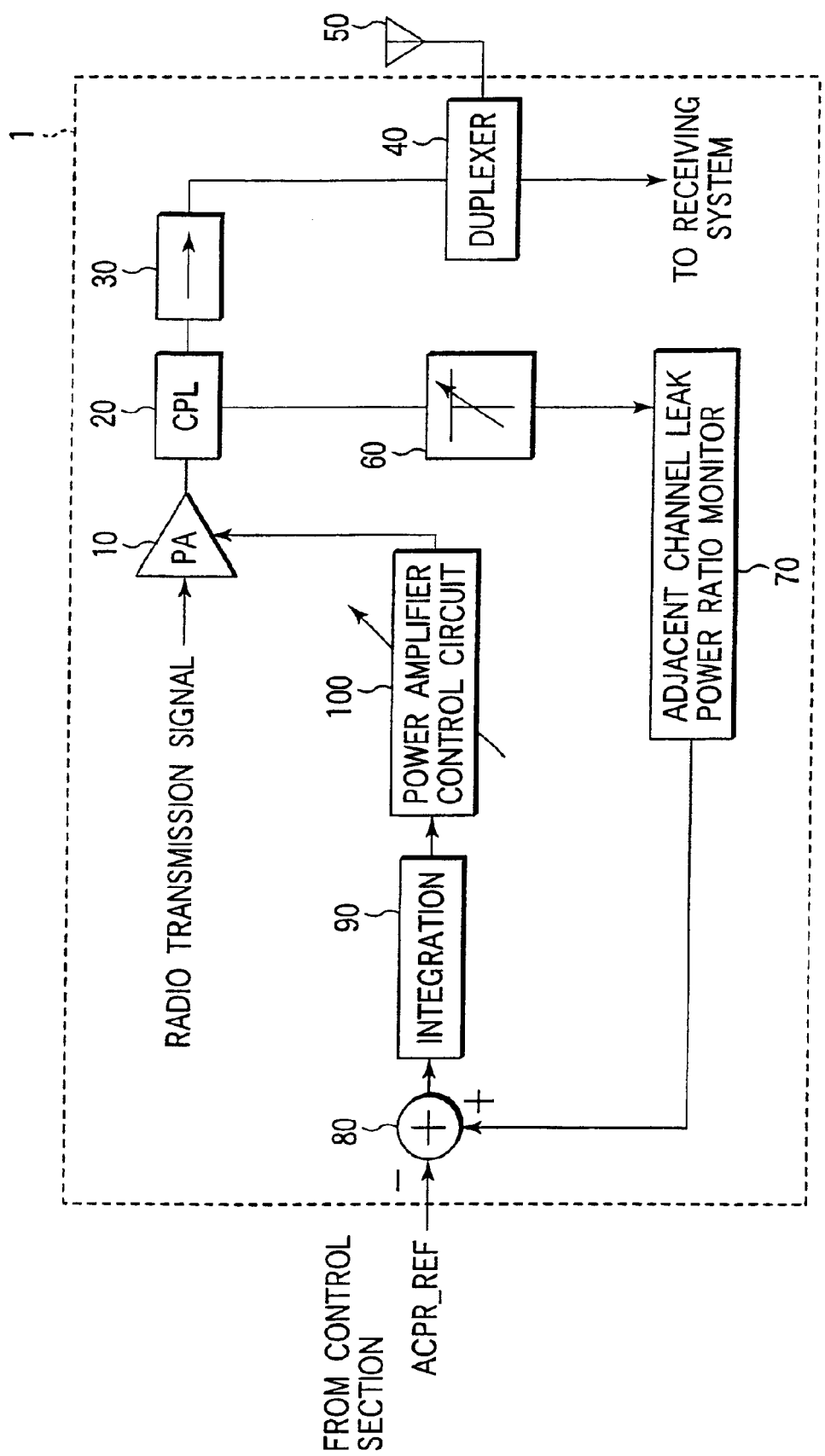
F I G. 2

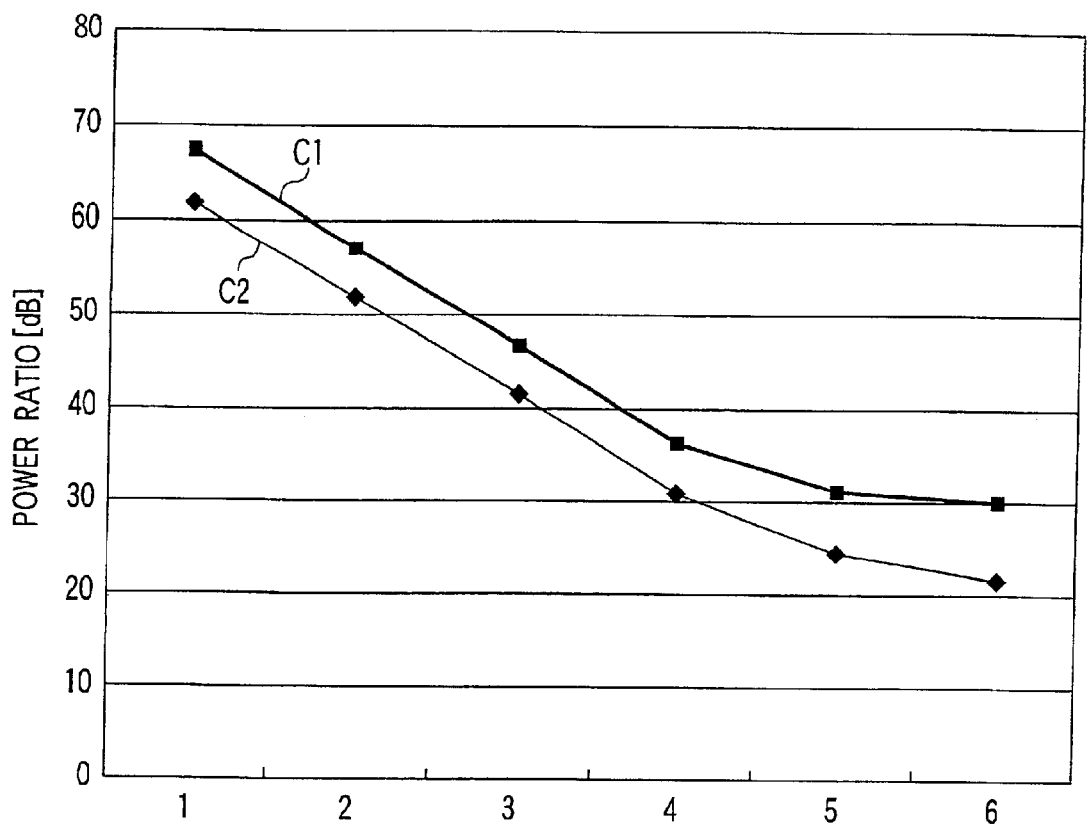
FIG. 9
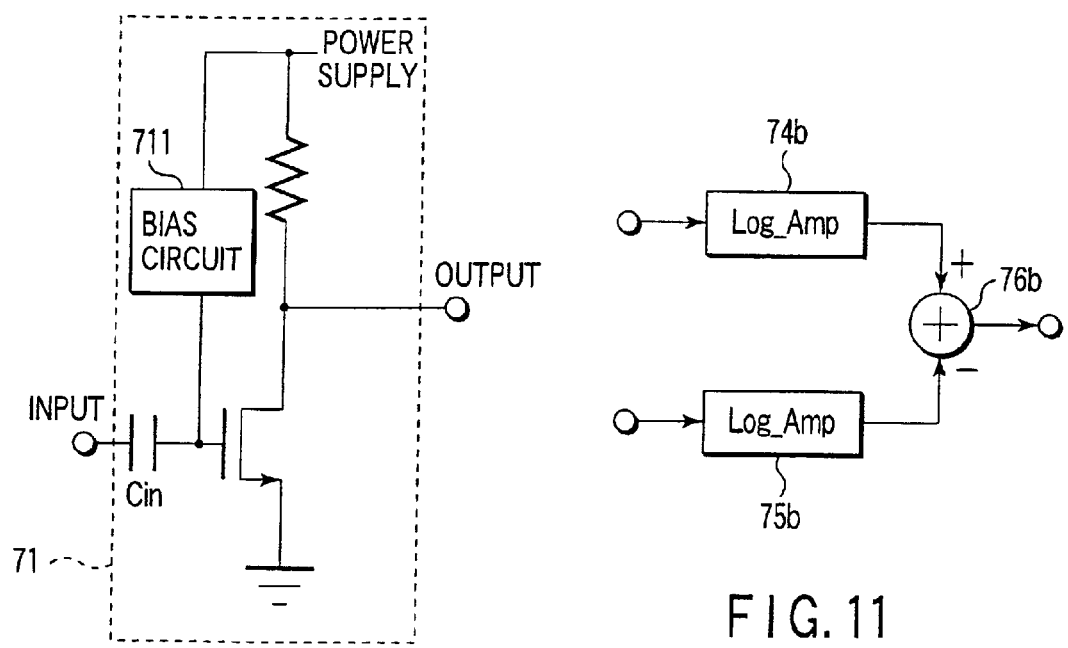
FIG. 10
FIG. 11

LEAK POWER RATIO DETECTION CIRCUIT, MOBILE COMMUNICATION TERMINAL, AND CONTROL CIRCUIT FOR MOBILE COMMUNICATION TERMINAL

CROSS-REFERENCE TO RELATED APPLICATIONS

This application is based upon and claims the benefit of priority from the prior Japanese Patent Application No. 2000-261575, filed Aug. 30, 2000, the entire contents of which are incorporated herein by reference.

BACKGROUND OF THE INVENTION

1. Field of the Invention

The present invention relates to a leak power ratio detection circuit for detecting an adjacent channel leak power ratio of a radio signal transmitted from, for example, a CDMA (Code Division Multiple Access) type mobile communication terminal.

2. Description of the Related Art

Amplitude modulation components are processed in uplink modulation methods of modern digital mobile communication systems, such as π/4 shift QPSK applied to PDC (Personal Digital Cellular) systems, OQPSK applied to cdmaOne systems, and HPSK applied to W-CDMA systems and cdma2000 systems.

A transmission power amplifier in the mobile communication terminal of this type is required to linearly amplify a transmission signal waveform including an amplitude variation component. However, the power consumption of the transmission power amplifier is disadvantageously increased in order to keep the linearity. In particular, in a case where the terminal transmission power is lowered because the mobile communication terminal is present near a base station, most of the power supplied from a cell to the power amplifier will be wasted.

In order to solve this problem, an idea is proposed that when a transmission power is not large, the supply power to the power amplifier is decreased in accordance with the level of the transmission power.

In general terms, if the power supplied to a power amplifier is excessively decreased, the linearity needed for an output signal level is lost, which leads to deterioration in adjacent channel leak power.

If consideration is given to the change in linearity due to a variance in manufacture of power amplifiers and an ambient temperature variation, it is difficult to control power supply to the power amplifiers. In order to avoid this advantage, it is a general method to decrease the degree in reduction of the supply power to the power amplifier. This method, however, fails to sufficiently decrease the power consumption.

Another possible method is to extract an adjacent channel leak power component from a radio transmission output signal using a filter, measure the level of the extracted leak power component, calculate a ratio between this level and the transmission output level to find an adjacent channel leak power ratio, and properly reduce the supply power to the power amplifier using information of this ratio.

In the mobile communication system, however, the frequency channel to be used is changed depending on cases. Thus, the center frequency of the aforementioned filter needs to be so varied as to be able to extract adjacent channel leak power components in association with all possible radio frequency channels. It is difficult to realize such a filter in the mobile communication terminal.

BRIEF SUMMARY OF THE INVENTION

An object of the present invention is to provide a leak power ratio detection circuit capable of detecting an adjacent channel leak power ratio irrespective of a radio frequency channel used, with an easily realizable structure.

Another object of the invention is to provide a mobile communication terminal capable of reducing power consumption by always operating a power amplifier with a minimum necessary supply power.

In order to achieve the objects, the present invention provides a leak power ratio detection circuit for detecting a leak power to an adjacent channel of a radio frequency signal produced by a transmission circuit including at least power amplifier means for power amplification of the radio frequency signal, the leak power ratio detection circuit comprising: squaring means for squaring the radio frequency signal produced by the transmission circuit and producing a low-frequency component; a first filter for extracting a spectrum component corresponding to a desired channel, from that portion of the low-frequency component of the squared result obtained by the squaring means, which occurs with a center thereof being present near a DC; a second filter for extracting, from the squared result of the squaring means, a spectrum component corresponding to spectrum spreading due to a distortion in the transmission circuit; and leak power ratio detection means for detecting a ratio of the leak power to the adjacent channel of the radio frequency signal, on the basis of a level of the spectrum component extracted by the first filter and a level of the spectrum component extracted by the second filter.

In the leak power ratio detection circuit with the above structure, the radio frequency signal is squared by the squaring means. The ratio of leak power to the adjacent channel is detected on the basis of the low-frequency spectrum component of the squared result of the squaring means, which has a center at the DC and has correlation with the spectrum of the desired channel, and the spectrum component corresponding to the spectrum spreading due to the distortion in the transmission circuit.

According to the leak power ratio detection circuit with the above structure, the adjacent channel leak power ratio can be detected on the basis of the analysis of the level of the spectrum in the low-frequency region, irrespective of the frequency of the channel used. Therefore, this invention can be easily realized.

To achieve the objects, the invention also provides a mobile communication terminal having, in a transmission system, power amplifier means for power-amplifying at least a radio frequency signal, the terminal comprising: branching means for branching a portion of the power-amplified radio frequency signal produced by the power amplifier means; squaring means for squaring the radio frequency signal branched by the branching means and producing a low-frequency component; a first filter for extracting a spectrum component corresponding to a desired channel, from that portion of the low-frequency component of the squared result obtained by the squaring means, which occurs with a center thereof being present near a DC; a second filter for extracting, from the squared result of the squaring means, a spectrum component corresponding to spectrum spreading due to a distortion in the transmission system; leak power ratio detection means for detecting a ratio of a leak power to an adjacent channel of the radio frequency signal, on the basis of a level of the spectrum component extracted by the first filter and a level of the spectrum component extracted by the second filter; and power amplification control means for controlling supply power to the power amplifier means, thereby making the ratio of the leak power detected by the leak power ratio detection means coincide with a predetermined level.

The invention also provides a control circuit for a mobile communication terminal having, in a transmission system, power amplifier means for power-amplifying at least a radio frequency signal, the terminal comprising: branching means for branching a portion of the power-amplified radio frequency signal produced by the power amplifier means; squaring means for squaring the radio frequency signal branched by the branching means and producing a low-frequency component; a first filter for extracting a spectrum component corresponding to a desired channel, from that portion of the low-frequency component of the squared result obtained by the squaring means, which occurs with a center thereof being present near a DC; a second filter for extracting, from the squared result of the squaring means, a spectrum component corresponding to spectrum spreading due to a distortion in the transmission system; leak power ratio detection means for detecting a ratio of a leak power to an adjacent channel of the radio frequency signal, on the basis of a level of the spectrum component extracted by the first filter and a level of the spectrum component extracted by the second filter; and power amplification control means for controlling supply power to the power amplifier means, thereby making the ratio of the leak power detected by the leak power ratio detection means coincide with a predetermined level.

In the mobile communication terminal and the control circuit with the above structures, the radio frequency signal is squared by the squaring means. The ratio of leak power to the adjacent channel is detected on the basis of the low-frequency spectrum component of the squared result of the squaring means, which has a center at the DC and has correlation with the spectrum of the desired channel, and the spectrum component corresponding to the spectrum spreading due to the distortion in the transmission circuit.

The supply power to the power amplifier means is controlled so as to make the detected ratio of the leak power coincide with a predetermined level.

Therefore, according to the mobile communication terminal and the control circuit with the above structures, the power amplifier can always be operated with a minimum necessary supply power, and the power consumption can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a circuit block diagram showing the structure of a part of a transmission system of the mobile communication terminal shown in FIG. 1;

FIG. 9 illustrates a relationship between a substitute monitor value detected by the adjacent channel leak power ratio monitor of the transmission system shown in FIG. 2, and a ratio of leak power to an adjacent channel;

FIG. 10 is a circuit block diagram showing another structure of the squaring circuit in the adjacent channel leak power ratio monitor shown in FIG. 3;

FIG. 11 is a circuit block diagram showing other structures of the level measuring circuits and level ratio measuring circuit in the adjacent channel leak power ratio monitor shown in FIG. 3;

DETAILED DESCRIPTION OF THE INVENTION

Embodiments of the present invention will now be described with reference to the accompanying drawing.

Figure 1:
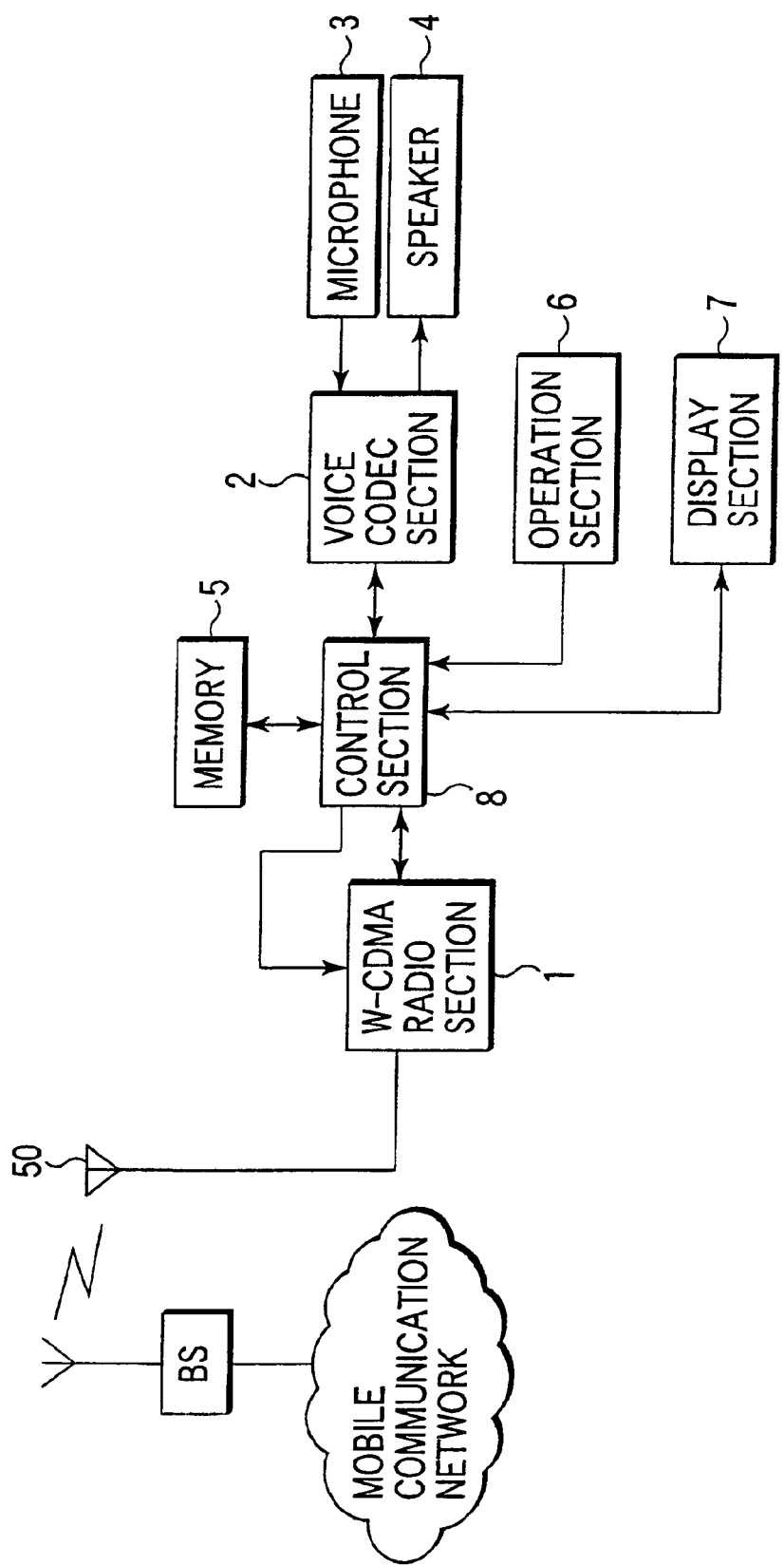
FIG. 1 is a circuit block diagram showing the structure of a mobile communication terminal according to an embodiment of the present invention.

FIG. 1 shows the structure of a mobile radio terminal according to an embodiment of the present invention, as well as a mobile communication system to which the mobile radio terminal is applied.

The mobile radio terminal is wirelessly connected to a base station BS of the mobile communication system, and communicates with some other communication station via a mobile communication network.

In the following description, it is assumed that W-CDMA (Wideband Code Division Multiple Access) is adopted as a method of communication with the base station BS.

In the W-CDMA, a high-rate, large-volume multimedia mobile communication is carried out using, e.g. a 5 MHz bandwidth in a 2 GHz band. Mobile radio terminals are discretely disposed within a service area and perform communication in synchronism with the base station BS connected to a public network.

A W-CDMA radio section 1 transmits and receives CDMA signals via an antenna 50 with a base station BS according to the W-CDMA method. The W-CDMA radio section 1 receives coded data from a voice CODEC section 2 via a control section 8, and transmits the coded data. On the other hand, the W-CDMA radio section 1 receives coded data and delivers it to the voice CODEC section 2 via the control section 8. The chip rate of spread codes is set at 4.096 Mcps, and a QPSK method is used as a first-order modulation method.

The voice CODEC section 2 encodes a transmission voice signal input from a microphone 3 according to a predetermined voice encoding method and passes the coded signal to the W-CDMA radio section 1 via the control section 8. In addition, the voice CODEC section 2 decodes the coded data input from the W-CDMA radio section 1 via the control section 8 and converts it to a reception signal. The reception signal is output from a loudspeaker 4 with amplified magnitude.

A memory 5 comprises a semiconductor memory such as a RAM or a ROM. The memory 5 stores control programs for the control section 8. In addition, the memory 5 stores, for instance, menu image data to be displayed on a display section 7.

An operation section 6 is a key input section comprising numeral keys, 4-direction keys, and various function keys. The operation section 6 receives a user's instructions on ordinary call transmission/reception, scrolling of information displayed on the display section 7, and the like.

The display section 7 comprises an LCD (Liquid Crystal Display), a plasma display, or the like.

The control section 8 controls the respective sections of the mobile radio terminal. Specifically, the control section 8 performs controls relating to, e.g. radio communication via the mobile communication network, and display on the display section 7.

FIG. 2 shows the antenna 50 and a transmission system of the W-CDMA radio section 1.

A radio transmission signal is obtained by frequency-converting a transmission signal to a radio-frequency signal by means of a frequency converter (not shown). A power amplifier (PA) 10 is supplied with power that is controlled by a power amplifier control circuit 100 (to be described below). The power amplifier 10 amplifies the radio transmission signal in accordance with the supplied power.

The amplified radio transmission signal is radiated to the space from the antenna 50 via a directional coupler (CPL) 20, an isolator 30 and a duplexer 40.

The directional coupler 20 branches only a small portion of a predetermined ratio of the radio transmission signal and delivers it to a variable attenuator 60.

The variable attenuator 60 adjusts the level of the radio transmission signal input from the directional coupler 20, and outputs the level-adjusted signal to an adjacent channel leak power ratio monitor 70.

The adjacent channel leak power ratio monitor 70 detects, as a substitute monitor value, a ratio of a leak power to an adjacent channel, which is possessed by the radio transmission signal to be emitted from the antenna 50. The detected substitute monitor value is input to a subtracter 80.

The subtracter 80 finds a difference between the substitute monitor value and a reference value (ACPR_REF) that is a target value of the adjacent channel leak power ratio. The reference value is provided from the control section 8.

An integrator 90 accumulates the difference found by the subtracter 80 for a predetermined time period and outputs the accumulated difference.

Based on the accumulated output from the integrator 90, the power amplifier control circuit 100 controls the supply power from a battery to the power amplifier 10 so that the power level of the radio transmission signal amplified by the power amplifier 10 may reach a predetermined level.

An example of the structure of the adjacent channel leak power ratio monitor 70 will now be described with reference to FIG. 3.

The level-adjusted radio transmission signal from the variable attenuator 60 is input to a squaring circuit ($X^2$) 71 and is thereby squared.

Figure 4:
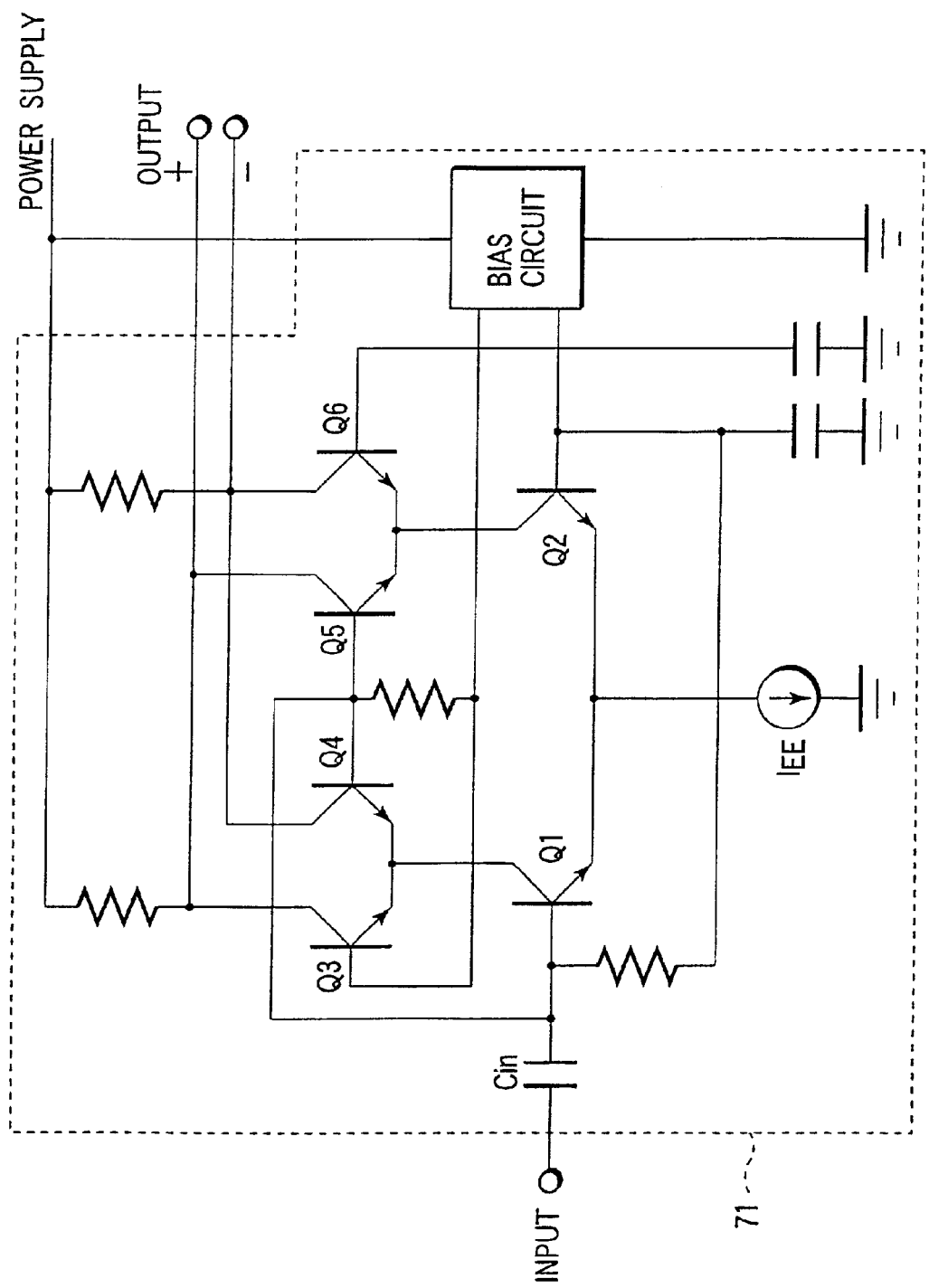
FIG. 4 is a block diagram showing a structure of a squaring circuit in the adjacent channel leak power ratio monitor shown in FIG. 3.

FIG. 4 shows an example of the structure of the squaring circuit 71.

The squaring circuit 71 shown in FIG. 4 includes a multiplier circuit. A circuit portion comprising transistors Q1, Q2, Q3, Q4, Q5 and Q6 constitutes a well-known Gilbert-type multiplier circuit.

The operation of this multiplier circuit is described in detail on pages 163–183 of "Analog Integrated Circuit Technology for VLSI, Vol. 2" (Baifukan). A product of a difference voltage between the bases of Q1 and Q2 and a difference voltage between the bases of Q3 and Q4 (or Q5 and Q6) is obtained as an output.

As is shown in FIG. 4, the bases of transistors Q2, Q3 and Q6 are AC-grounded. An input signal from an input terminal (INPUT) (i.e. the output from the attenuator 60) is commonly supplied to the bases of transistors Q1, Q4 and Q5. Thereby, signals obtained by squaring the input signal are output from output terminals (OUTPUT).

Although not shown in FIG. 4, negative feedback technologies or pre-distortion technologies may be used to increase the input voltage range, as described in the above-mentioned publication.

In this way, the radio transmission signals squared by the squaring circuit 71 are output to band-pass filters (BPF) 72 and 73.

The band-pass filter 72 extracts a spectrum component corresponding to a desired channel, from that low-frequency component of the output of the squaring circuit 71, which occurs at low frequencies with a center thereof being present near a DC (Direct Current).

On the other hand, the band-pass filter 73 extracts, from the output of the squaring circuit 71, a spectrum component that corresponds to spectrum spreading due to distortion in the transmission system.

The band-pass filter 72 may theoretically be a low-pass filter. However, if consideration is given to elimination of the effect of DC offset occurring in the squaring circuit 71, it is desirable that the band-pass filter 72 be a band-pass filter having a pass band necessary for extracting a component corresponding to a modulation signal.

A level measuring circuit (LEVEL) 74 measures a signal level of the spectrum component extracted by the band-pass filter 72.

A level measuring circuit (LEVEL) 75 measures a signal level of the spectrum component extracted by the band-pass filter 73.

A level ratio measuring circuit (RATIO) 76 measures a ratio between the level measured by the level measuring circuit 74 and the level measured by the level measuring circuit 75, and outputs a measured result to the subtracter 80 as the aforementioned substitute monitor value.

Figure 5:
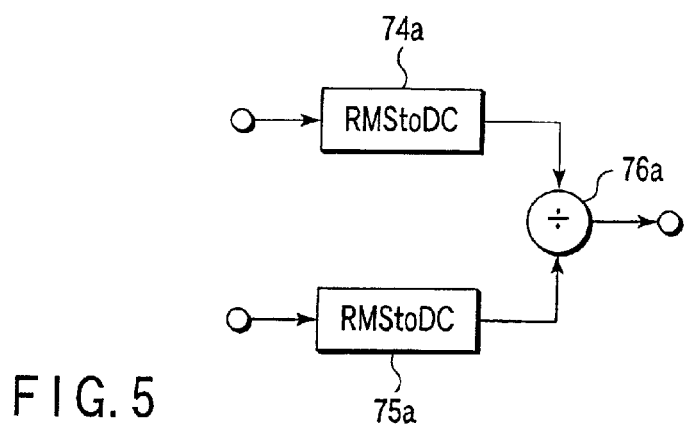
FIG. 5 is a circuit block diagram showing structures of level measuring circuits and a level ratio measuring circuit in the adjacent channel leak power ratio monitor shown in FIG. 3.

FIG. 5 shows an example of structures of the level measuring circuits 74 and 75 and level ratio measuring circuit 76.

In FIG. 5, an RMStoDC circuit (RMStoDC) 74a corresponds the level measuring circuit 74, and an RMStoDC circuit (RMStoDC) 75a corresponds the level measuring circuit 75. A division circuit (÷) 76a corresponds to the level ratio measuring circuit 76.

The RMStoDC circuits (RMStoDC) 74a and 75a are circuits for outputting effective values of the input signals as DC signals. Their functions are realized, for instance, by IC products "AD8361" marketed by Analog Devices Corp.

The division circuit 76a is a division circuit for outputting a division result of the two inputs. This function is realized, for instance, by an analog multiplier IC "NJM4200" marketed by Kabushiki-kaisha Shin-Nippon Musen. This company publishes "Bi-polar IC Data Book '94 (Audio/Vide/Communication/Special Edition)," in which the method of constructing this device is described in detail (pp. 7–130).

The operation of the transmission system of the mobile communication terminal with the above structure will now be described.

Figure 6:
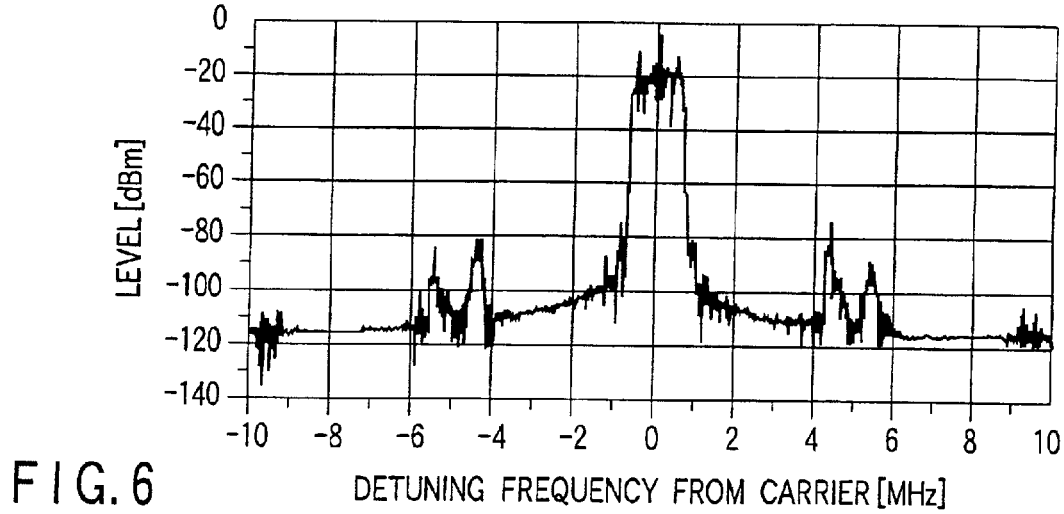
FIG. 6 shows a spectrum of a detuning frequency from a carrier frequency of a radio transmission signal.
Figure 7:
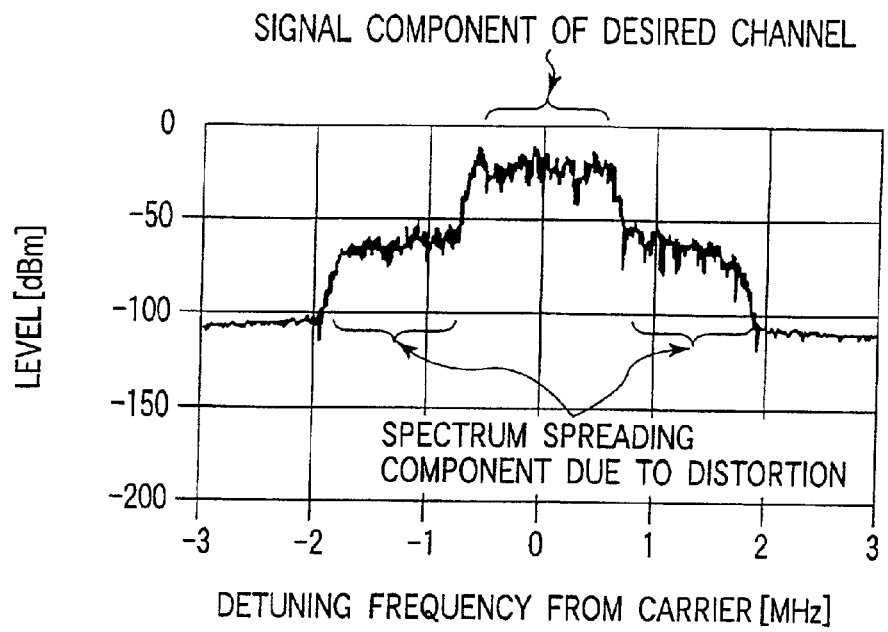
FIG. 7 shows a spectrum of a detuning frequency from a carrier frequency of a radio transmission signal.
Figure 8:
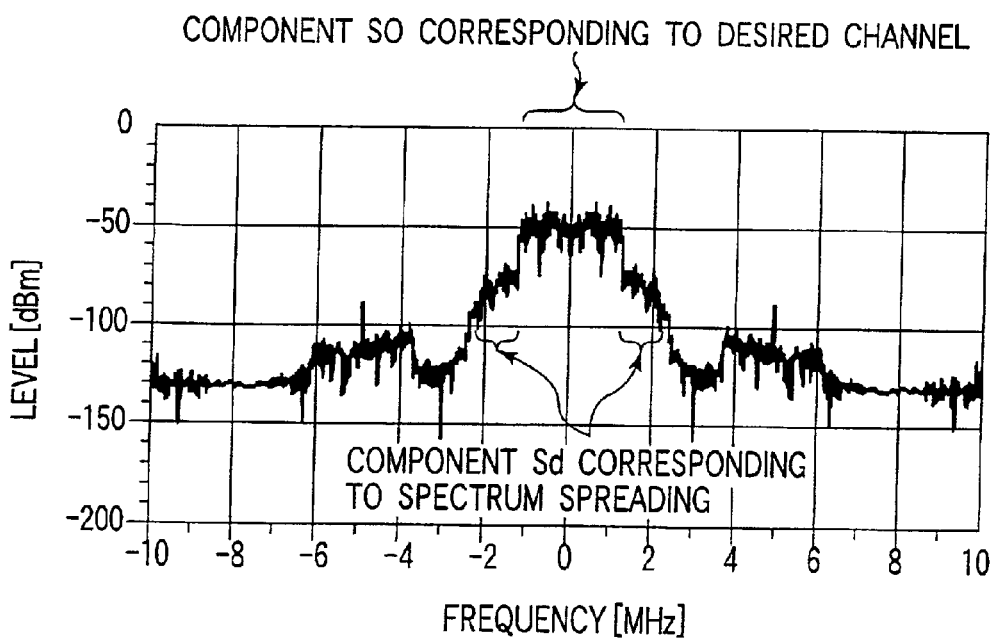
FIG. 8 shows a spectrum occurring at low frequencies with a center set near a DC, in a case where a radio transmission signal is squared.

Referring to FIGS. 6 to 8, a description will be given of an operation of the adjacent channel leak power ratio monitor 70 for detecting a ratio (substitute monitor value) of leak power to an adjacent channel.

FIG. 6 shows characteristics of a radio transmission signal input to the squaring circuit 71 in a case where no distortion is caused by the transmission system. FIG. 6 shows a spectrum of the radio transmission signal, with the abscissa indicating a detuning frequency from a carrier frequency (i.e. a frequency detuned from a carrier frequency).

In FIG. 6, a component near ±5 MHz is caused by sampling in a process of generating a transmission signal in a base band. This component can easily be removed by a filter, and no problem will arise.

On the other hand, FIG. 7 shows characteristics in a case where distortion is caused by the transmission system.

FIG. 7, like FIG. 6, shows a spectrum of the radio transmission signal, with the abscissa indicating a detuning frequency from a carrier frequency.

FIG. 7 shows a spectrum with distortion caused by the amplifier of the transmission system having third-order mutual modulation distortion (IP3) characteristics. It is understood that the spectrum is spread due to distortion.

This kind of distortion will significantly occur in a circuit using high-power signals, such as the power amplifier 10. The spreading of the spectrum causes interference with a user who is using an adjacent frequency for communication. Thus, in the mobile communication system, a power ratio between the spreading portion of the spectrum and a spectrum portion associated with a desired channel is strictly specified as an adjacent channel leak power ratio.

FIG. 8 shows characteristics of the radio transmission signal with distortion, which has been squared by the squaring circuit 71.

It is understood from FIG. 8 that the squared result of the radio transmission signal with the spectrum shown in FIG. 7 retains the spreading of the spectrum due to distortion as shown in FIG. 7, although the shape of the spreading is a little different.

FIG. 9 shows a variation C1 in power ratio between the spectrum of the desired channel and the spreading portion of the spectrum due to distortion in FIG. 7, and a variation C2 in power ratio between the spectrum corresponding to the desired channel and the component corresponding to the spreading of the spectrum due to distortion in FIG. 8, in a case where the distortion characteristics of the power amplifier 10 causing distortion in the radio transmission signal, that is, the third-order mutual modulation characteristics, are varied.

It is understood from FIG. 9 that there is a close correlation between the power ratio between the spectrum component corresponding to the desired channel and the component corresponding to the spreading of the spectrum due to distortion in FIG. 8, on the one hand, and the power ratio between the spectrum of the desired channel and the spreading portion of the spectrum due to distortion in FIG. 7, on the other hand.

Figure 3:
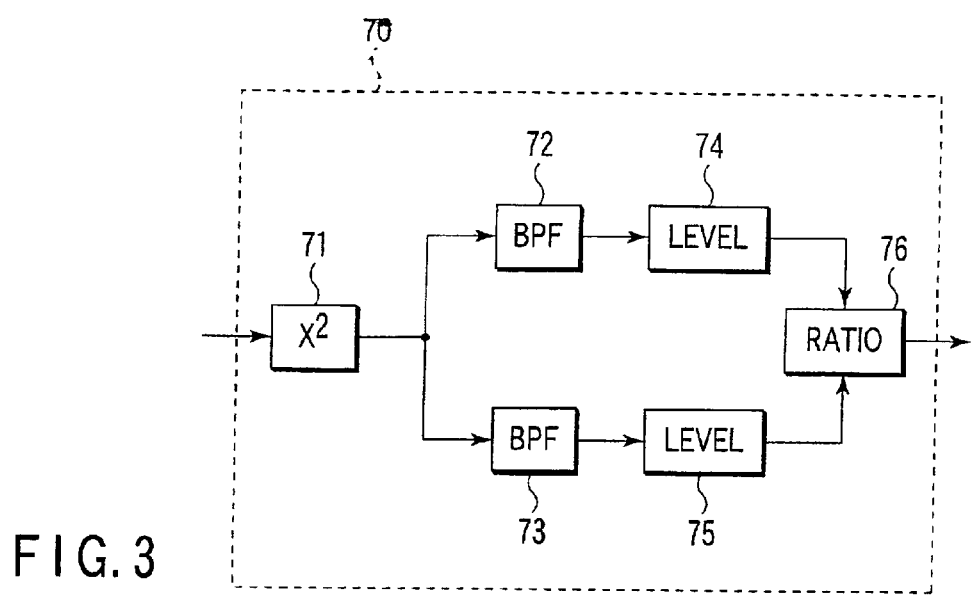
FIG. 3 is a circuit block diagram showing the structure of an adjacent channel leak power ratio monitor of the transmission system shown in FIG. 2.

Accordingly, a substitute monitor value for the adjacent channel leak power ratio at the radio frequency can be found if the power ratio between the spectrum component corresponding to the desired channel and the component corresponding to the spreading of the spectrum due to distortion in FIG. 8 is found by the adjacent channel leak power ratio monitor 70 having the structure shown in FIG. 3.

The radio transmission signals squared by the squaring circuit 71 are output to the band-pass filters 72 and 73. The band-pass filter 72 extracts a spectrum component S0, which corresponds to the desired channel, from the component occurring near the DC. On the other hand, the band-pass filter 73 extracts a spectrum component Sd that corresponds to spectrum spreading due to distortion.

The level measuring circuit 74 measures the signal level of the spectrum component S0 extracted by the band-pass filter 72. On the other hand, the level measuring circuit 75 measures the signal level of the spectrum component Sd extracted by the band-pass filter 73.

The level ratio measuring circuit 76 measures the ratio between the level of the spectrum component S0 corresponding to the desired channel and the level of the component Sd corresponding to the spectrum spreading due to distortion, and outputs a measured result to the subtracter 80 as the substitute monitor value.

A description will now be given of the operation for controlling the supply power to the power amplifier 10 by means of the feedback loop from the adjacent channel leak power ratio monitor 70 to the power amplifier control circuit 100.

If the battery supply power to the power amplifier 10 is too large in view of the required adjacent channel leak power ratio, the substitute monitor value measured by the adjacent channel leak power ratio monitor 70 increases. As a result, the output from the subtracter 80 takes a positive value, and positive values are accumulated in the integrator 90.

When the output of the integrator 90 takes a positive value, the power amplifier control circuit 100 functions to reduce the battery supply power to the power amplifier 10. With this control operation, the power amplifier 10 operates under the condition of low power consumption.

Assume that the operation of the power amplifier 10 with low power consumption has caused a deterioration in the distortion performance. If the adjacent channel leak power ratio deteriorates and lowers below the reference value (ACPR_REF), or the target value of the adjacent channel leak power ratio, the output of the subtracter 80 takes a negative value. Thus, a reverse control is effected to increase the battery supply power to the power amplifier 10.

The adjacent channel leak power ratio of the radio transmission signal will ultimately converge at a value corresponding to ACPR_REF.

The reference value (ACPR_REF) may be a fixed value or a variable value varying according to the transmission output level.

As has been described above, in the transmission system of the mobile communication terminal with the above structure, the radio transmission signal is squared by the squaring circuit 71, and the ratio of leak power to the adjacent channel is detected on the basis of the low-frequency spectrum component having a center near the DC and correlation with the spectrum of the desired channel, and the spectrum component corresponding to the spreading of the spectrum due to the distortion of the transmission system.

According to the transmission system of the mobile communication terminal with the above structure, the adjacent channel leak power ratio can be detected by the analysis of the level of the spectrum at the low-frequency region, irrespective of the radio frequency channel. Thus, the ratio of leak power to the adjacent channel can be easily measured. Based on the measured ratio, the battery supply power to the power amplifier 10 can always be set at a minimum necessary level, and the power consumption can be reduced.

The present invention is not limited to the above embodiment.

The structure of the squaring circuit 71 in the above embodiment is not limited to that shown in FIG. 4. For example, the squaring circuit 71 may have a structure shown in FIG. 10.

The squaring circuit shown in FIG. 10 uses a MOS transistor as a non-linear element having a second-order distortion coefficient.

As is well known, as regards I-V characteristics in a saturated region of a MOS transistor, a drain current $I_D$ is expressed by $$I_D = K(V_{GS} - V_T)^2$$

wherein K is a constant of proportion,
$I_D$ is a drain current,
$V_{GS}$ is a gate-source current, and
$V_T$ is a threshold voltage.

Assume that a bias circuit 711 shown in FIG. 10 is set to provide $$V_{GS} = V_T + \alpha.$$

If a signal Vi is input to the input terminal INPUT by AC coupling, the output terminal OUTPUT produces $$V = R_L \cdot I_D = R_L \cdot K(Vi + \alpha)^2 = R_L \cdot K(Vi^2 + 2\alpha \cdot Vi + \alpha^2).$$

If a bias is properly set to establish the relationship, $\alpha < Vi$, a square of Vi can be approximately obtained.
In this case, a DC offset value $\alpha^2$ can be eliminated by the band-pass filter 72, 73 at the next stage.

In the example shown in FIG. 10, the MOS transistor is described as the non-linear device having the second-order distortion coefficient. However, the same advantage can be obtained with use of any type of non-linear device having a second-order distortion coefficient.

In the above-described embodiment, the level measuring circuits 74 and 75 and level ratio measuring circuit 76 having the structures shown in FIG. 5 are used. Alternatively, these circuits may have structures as shown in FIG. 11.

In FIG. 11, a Log_Amp circuit (Log_Amp) 74b corresponds to the level measuring circuit 74, and a Log_Amp circuit (Log_Amp) 75b corresponds to the level measuring circuit 75. A subtracter (+) 76b corresponds to the level ratio measuring circuit 76.

The Log_Amp circuits 74b and 75b are Log_Amp circuits for logarithmically compressing the input signal levels and outputting DC signals. These functions are realized, for example, by IC products "AD9310" marketed by Analog Devices Corp.

The subtracter 76b is a subtracter circuit for outputting a result of the subtraction between two inputs, and it can easily be constructed using an operational amplifier.

With this structure, a level ratio of two signals can be easily obtained.

In particular, in FIG. 11, since the Log_Amp circuits 74b and 75b are used for the level measurement, these circuits can be operated over a wide input level range. In addition, since the level measurement outputs have decibel values, the level ratio measuring circuit 76 may comprise a simple subtracter circuit and can advantageously be constructed with simple structure.

Figure 12:
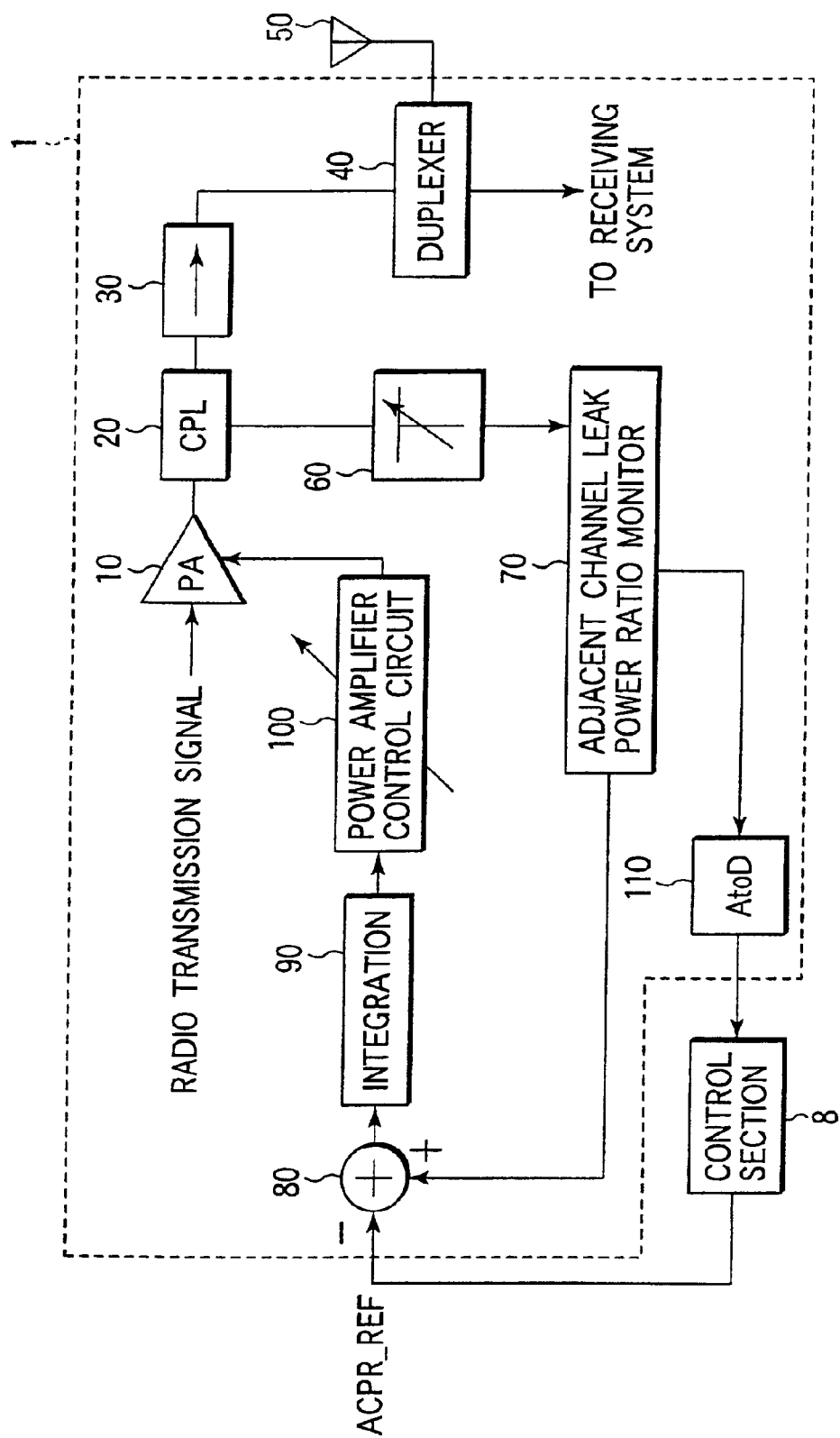
FIG. 12 is a circuit block diagram showing the structure of a transmission system of a mobile communication terminal according to another embodiment of the invention.
Figure 13:
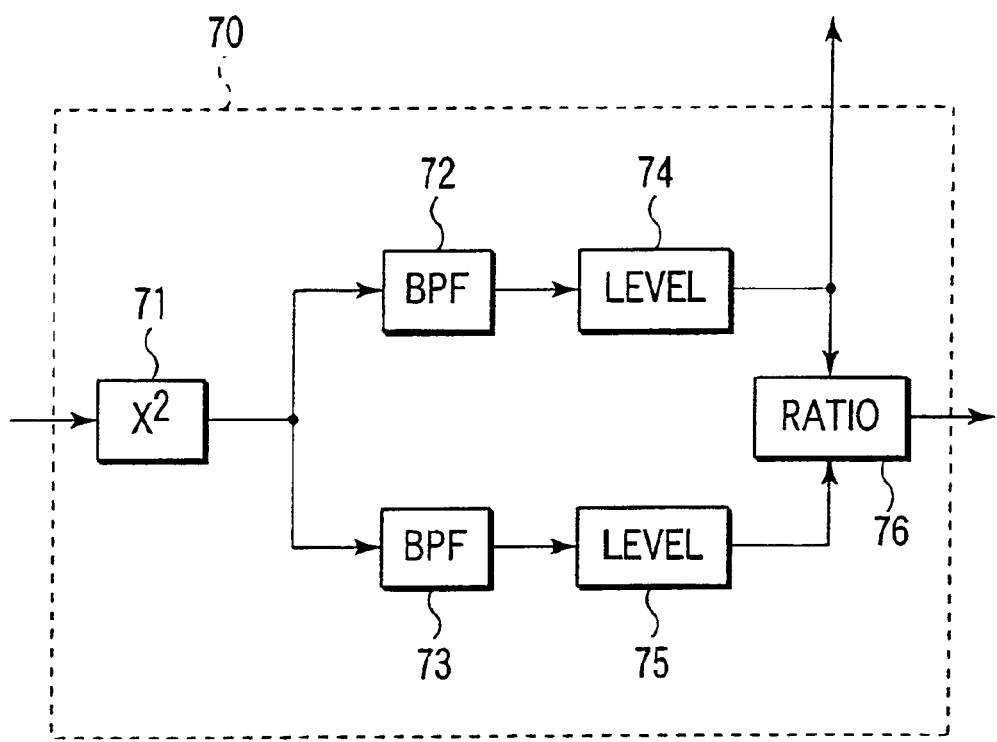
FIG. 13 is a circuit block diagram showing a structure of an adjacent channel leak power ratio monitor of the transmission system shown in FIG. 12.

Alternatively, as shown in FIG. 12, an A/D converter (A to D) 110 may be added, and the adjacent channel leak power ratio monitor 70 may be constructed to derive an output from the level measuring circuit 74, as shown in FIG. 13.

The output of the level measuring circuit 74 is converted to a digital value by the A/D converter 110. Based on the digital value, a control section 8 for controlling the entirety of the mobile communication terminal may control the upper limit of the gain of the transmission system so that the gain may not exceed a tolerable maximum transmission power level.

The attenuator 60 is not necessarily required if the adjacent channel leak power ratio monitor 70 has a sufficiently wide input level tolerable range from the viewpoint of circuitry, and if the radio transmission signal branched from the directional coupler 20 falls within the input level tolerable range of the adjacent channel leak power ratio monitor 70 from the viewpoint of circuitry. Alternatively, the attenuator 60 may be replaced with an attenuator having a fixed value.

In the above-described embodiments, the supply power to the power amplifier 10 is continuously controlled making use of the output of the adjacent channel leak power ratio monitor 70. Alternatively, the output of the adjacent channel leak power ratio monitor 70 may be A/D converted. In this case, the result of conversion is input to the control section 8. The control section 8 realizes the functions of the subtracter 80 and integrator 90 by software, and non-successively controls the power amplifier control circuit 100.

Since the present invention is achieved by using baseband frequencies in the circuit components of the adjacent channel leak power ratio monitor 70, which begins with the squaring circuit 71, the reduction in size of the monitor 70 can be easily realized by integrated circuits and the monitor 70 can be provided in the control section for controlling the mobile communication terminal.

In addition, the present invention can be realized by adopting various techniques, for example, using analog circuitry or digital circuitry, or using hardware or software.

Needless to say, other modifications may be made to the present invention without departing from the spirit of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A leak power ratio detection circuit for detecting a leak power to an adjacent channel of a radio frequency signal produced by a transmission circuit including at least power amplifier means for power amplification of the radio frequency signal, the leak power ratio detection circuit comprising:

squaring means for squaring the radio frequency signal produced by the transmission circuit and producing a low-frequency component;

a first filter for extracting a spectrum component corresponding to a desired channel, from that portion of the low-frequency component of the squared result obtained by the squaring means, which occurs with a center thereof being present near a DC (Direct Current);

a second filter for extracting, from the squared result of the squaring means, a spectrum component corresponding to spectrum spreading due to a distortion in the transmission circuit; and leak power ratio detection means for detecting a ratio of the leak power to the adjacent channel of the radio frequency signal, on the basis of a level of the spectrum component extracted by the first filter and a level of the spectrum component extracted by the second filter.

2. The leak power ratio detection circuit according to claim 1, wherein the squaring means squares the radio frequency signal using multiplier means for multiplying at least two signals.

3. The leak power ratio detection circuit according to claim 1, wherein the squaring means squares the radio frequency signal using a non-linear device having a second-order distortion coefficient.

4. The leak power ratio detection circuit according to claim 1, wherein the leak power ratio detection means comprises:

first level detection means for detecting an effective value of the spectrum component extracted by the first filter;

second level detection means for detecting an effective value of the spectrum component extracted by the second filter; and division means for detecting the ratio of the leak power to the adjacent channel of the radio frequency signal, on the basis of a ratio between the effective value detected by the first level detection means and the effective value detected by the second level detection means.

5. The leak power ratio detection circuit according to claim 1, wherein the leak power ratio detection means comprises:

first level detection means for detecting a decibel value of the level of the spectrum component extracted by the first filter;

second level detection means for detecting a decibel value of the level of the spectrum component extracted by the second filter; and subtraction means for detecting the ratio of the leak power to the adjacent channel of the radio frequency signal by performing a subtraction between the decibel value detected by the first level detection means and the decibel value detected by the second level detection means.

6. A mobile communication terminal having, in a transmission system, power amplifier means for power-amplifying at least a radio frequency signal, the terminal comprising:

branching means for branching a portion of the power-amplified radio frequency signal produced by the power amplifier means;

squaring means for squaring the radio frequency signal branched by the branching means and producing a low-frequency component;

a first filter for extracting a spectrum component corresponding to a desired channel, from that portion of the low-frequency component of the squared result obtained by the squaring means, which occurs with a center thereof being present near a DC (Direct Current);

a second filter for extracting, from the squared result of the squaring means, a spectrum component corresponding to spectrum spreading due to a distortion in the transmission system;

leak power ratio detection means for detecting a ratio of a leak power to an adjacent channel of the radio frequency signal, on the basis of a level of the spectrum component extracted by the first filter and a level of the spectrum component extracted by the second filter; and power amplification control means for controlling supply power to the power amplifier means, thereby making the ratio of the leak power detected by the leak power ratio detection means coincide with a predetermined level.

7. The mobile communication terminal according to claim 6, wherein the squaring means squares the radio frequency signal using multiplier means for multiplying at least two signals.

8. The mobile communication terminal according to claim 6, wherein the squaring means squares the radio frequency signal using a non-linear device having a second-order distortion coefficient.

9. The mobile communication terminal according to claim 6, wherein the leak power ratio detection means comprises:

first level detection means for detecting an effective value of the spectrum component extracted by the first filter;

second level detection means for detecting an effective value of the spectrum component extracted by the second filter; and comparison means for detecting the ratio of the leak power to the adjacent channel of the radio frequency signal, on the basis of a ratio between the effective value detected by the first level detection means and the effective value detected by the second level detection means.

10. The mobile communication terminal according to claim 6, wherein the leak power ratio detection means comprises:

first level detection means for detecting a decibel value of the level of the spectrum component extracted by the first filter;

second level detection means for detecting a decibel value of the level of the spectrum component extracted by the second filter; and subtraction means for detecting the ratio of the leak power to the adjacent channel of the radio frequency signal by performing a subtraction between the decibel value detected by the first level detection means and the decibel value detected by the second level detection means.

11. The mobile communication terminal according to claim 6, further comprising control means for controlling a maximum power level of the radio frequency signal to be transmitted, on the basis of the level of the spectrum component extracted by the first filter.

12. A control circuit for a mobile communication terminal having, in a transmission system, power amplifier means for power-amplifying at least a radio frequency signal, the terminal comprising:

branching means for branching a portion of the power-amplified radio frequency signal produced by the power amplifier means;

squaring means for squaring the radio frequency signal branched by the branching means and producing a low-frequency component;

a first filter for extracting a spectrum component corresponding to a desired channel, from that portion of the low-frequency component of the squared result obtained by the squaring means, which occurs with a center thereof being present near a DC (Direct Current);

a second filter for extracting, from the squared result of the squaring means, a spectrum component corresponding to spectrum spreading due to a distortion in the transmission system;

leak power ratio detection means for detecting a ratio of a leak power to an adjacent channel of the radio frequency signal, on the basis of a level of the spectrum component extracted by the first filter and a level of the spectrum component extracted by the second filter; and power amplification control means for controlling supply power to the power amplifier means, thereby making the ratio of the leak power detected by the leak power ratio detection means coincide with a predetermined level.

13. The control circuit for a mobile communication terminal according to claim 12, wherein the squaring means squares the radio frequency signal using multiplier means for multiplying at least two signals.

14. The control circuit for a mobile communication terminal according to claim 12, wherein the squaring means squares the radio frequency signal using a non-linear device having a second-order distortion coefficient.

15. The control circuit for a mobile communication terminal according to claim 12, wherein the leak power ratio detection means comprises:

first level detection means for detecting an effective value of the spectrum component extracted by the first filter;

second level detection means for detecting an effective value of the spectrum component extracted by the second filter; and comparison means for detecting the ratio of the leak power to the adjacent channel of the radio frequency signal, on the basis of a ratio between the effective value detected by the first level detection means and the effective value detected by the second level detection means.

16. The control circuit for a mobile communication terminal according to claim 12, wherein the leak power ratio detection means comprises:

first level detection means for detecting a decibel value of the level of the spectrum component extracted by the first filter;

second level detection means for detecting a decibel value of the level of the spectrum component extracted by the second filter; and subtraction means for detecting the ratio of the leak power to the adjacent channel of the radio frequency signal by performing a subtraction between the decibel value detected by the first level detection means and the decibel value detected by the second level detection means.

17. The control circuit for a mobile communication terminal according to claim 12, further comprising control means for controlling a maximum power level of the radio frequency signal to be transmitted, on the basis of the level of the spectrum component extracted by the first filter.

* * * * *